United States Patent
Ionescu et al.

(10) Patent No.: US 11,356,016 B1
(45) Date of Patent: Jun. 7, 2022

(54) MULTI-STAGE CHARGE PUMP CIRCUIT

(71) Applicant: Infineon Technologies AG, Neubiberg (DE)

(72) Inventors: Mihai-Alexandru Ionescu, Graefelfing (DE); Ardit Tabaku, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/198,557

(22) Filed: Mar. 11, 2021

(51) Int. Cl.
*H02M 3/07* (2006.01)
*H03K 17/567* (2006.01)

(52) U.S. Cl.
CPC ............ *H02M 3/07* (2013.01); *H03K 17/567* (2013.01)

(58) Field of Classification Search
CPC ............................... H02M 3/07; H03K 17/567
See application file for complete search history.

(56) References Cited

U.S. PATENT DOCUMENTS

| | | | |
|---|---|---|---|
| 5,635,776 A * | 6/1997 | Imi | H02M 3/07 307/108 |
| 10,084,384 B1 | 9/2018 | Kotikalapoodi | |
| 2007/0097719 A1 | 5/2007 | Parramon et al. | |
| 2008/0157732 A1 | 7/2008 | Williams | |
| 2011/0101938 A1 | 5/2011 | Ma et al. | |
| 2018/0205315 A1 | 7/2018 | Giuliano et al. | |

FOREIGN PATENT DOCUMENTS

| | | |
|---|---|---|
| CN | 107612318 A | 1/2018 |
| WO | 9828673 A1 | 7/1998 |

* cited by examiner

*Primary Examiner* — Sibin Chen
(74) *Attorney, Agent, or Firm* — Shumaker & Sieffert, P.A.

(57) ABSTRACT

This disclosure describes a charge pump circuit comprising a plurality of switches configured to control phases of the charge pump circuit for charging a first capacitor, a second capacitor and a third capacitor. The phases may include: a first phase that charges the first capacitor to a first voltage based on an input voltage; a second phase that charges the second capacitor to a second voltage based on the first voltage and the input voltage; a third phase that charges the first capacitor to a third voltage based on the input voltage; and a fourth phase that charges the third capacitor to a fourth voltage based the second voltage, the third voltage, and the input voltage. In some examples, one or more of the capacitors are charged with duty cycles that are less than 50 percent.

19 Claims, 7 Drawing Sheets

MULTI-STAGE CHARGE PUMP CIRCUIT

TECHNICAL FIELD

This disclosure relates to charge pump circuits.

BACKGROUND

Charge pump circuits are used in a variety of DC power settings to provide a stepped-up voltage. One particular use of a charge pump circuit is to provide gate driver voltages above a DC power source. The gate driver voltages created by charge pump circuits, for example, may be used in a gate driver circuit to control on/off switching of NMOS power transistors. This is merely one example use of charge pump circuits, and charge pump circuits may be useful in a wide variety of other situations or settings.

SUMMARY

This disclosure describes a multi-stage charge pump circuit comprising multiple stages that each include a floating capacitor. The charge pump circuit may eliminate the need for a so-called "buffering capacitor" that is coupled to a ground voltage between different charge pump stages, and may reduce the number of pins needed in the charge pump circuit (e.g., to seven or fewer pins). The charge pump circuit may control capacitor charging of each floating capacitor in each stage according to specific duty cycles. The charge pump circuit may be used anywhere a charge pump is desirable or useful and may be especially useful for gate driver circuits used to control NMOS power switches in automotive settings.

A plurality of switches may be configured to control N stages of the charge pump circuit that each include a floating capacitor, wherein N is a positive integer greater than 1. Each floating capacitor is "floating" in the sense that the capacitor is not permanently coupled to either a ground voltage or an input voltage. An output of the charge pump circuit may be approximately $2^N$ times the input voltage. A first stage of the charge pump circuit may charge its floating capacitor according to a 50 percent duty cycle, and a second stage may charge its floating capacitor according to a 25 percent duty cycle. In some cases, the charge pump circuit may include a third stage, and the third stage may charge its floating capacitor according to a 12.5 percent duty cycle. Furthermore, the charge pump circuit include a fourth stage, and the third stage may charge its floating capacitor according to a 6.25 percent duty cycle. Any number (N) of stages may be used, where N is an integer greater than 1. The floating capacitor of each of the N stages may be charged according to a duty cycle that is $\frac{1}{2}^n$ of a total duty cycle associated with all N stages, wherein n represents each integer associated each of the N stages.

In one example, this disclosure describes a charge pump circuit comprising a plurality of switches configured to control phases of the charge pump circuit for charging a first capacitor, a second capacitor and a third capacitor. The phases may include: a first phase that charges the first capacitor to a first voltage based on an input voltage; a second phase that charges the second capacitor to a second voltage based on the first voltage and the input voltage; a third phase that charges the first capacitor to a third voltage based on the input voltage; and a fourth phase that charges the third capacitor to a fourth voltage based the second voltage, the third voltage, and the input voltage.

In another example, this disclosure describes a method that comprises controlling a plurality of switches to control phases of a charge pump circuit for charging a first capacitor, a second capacitor and a third capacitor. Controlling the phases may include: controlling a first phase to charge the first capacitor to a first voltage based on an input voltage; controlling a second phase to charge the second capacitor to a second voltage based on the first voltage and the input voltage; controlling a third phase to charge the first capacitor to a third voltage based on the input voltage; and controlling a fourth phase to charge the third capacitor to a fourth voltage based the second voltage, the third voltage, and the input voltage.

In another example, a charge pump circuit comprises a first capacitor, a second capacitor, a third capacitor, and a plurality of switches configured to control phases of the charge pump circuit for charging the first capacitor, the second capacitor and the third capacitor. The phases may include: a first phase that charges the first capacitor to a first voltage based on an input voltage; a second phase that charges the second capacitor to a second voltage based on the first voltage and the input voltage; a third phase that charges the first capacitor to a third voltage based on the input voltage; and a fourth phase that charges the third capacitor to a fourth voltage based the second voltage, the third voltage, and the input voltage.

Details of these and other examples are set forth in the accompanying drawings and the description below. Other features, objects, and advantages will be apparent from the description and drawings, and from the claims.

DETAILED DESCRIPTION

This disclosure describes a charge pump circuit that includes multiple stages. Each of the multiple stages of the charge pump circuit may include a floating capacitor that is not permanently coupled to either a ground voltage or an input voltage. The charge pump circuit may include a plurality of switches (e.g., transistors or possibly diodes), which may operate in charge pump circuit in four or more phases to charge the different capacitors. The charge pump circuit may be used anywhere a charge pump is desirable or useful and may be especially useful for gate driver circuits that are used to control NMOS power switches in automotive settings.

NMOS power transistors, for example, typically require a substantial gate to source voltage in order to control the ON/OFF switching of such power transistors. There are situations (sometimes called "cold cranking" situations) where a battery voltage itself may be insufficient to control NMOS power switches due to large battery drain (e.g. by an electric starter motor of a vehicle). In these or other situations or settings, a charge pump circuit may be used to provide a stepped-up voltage.

The circuit designs and techniques of this disclosure may eliminate the need for a so-called "buffering capacitor" between charge pump stages, and in doing so, the designs and techniques may reduce the number of pins needed in the charge pump circuit (e.g., to seven or fewer pins). The described charge pump circuit may control capacitor charging in each stage according to specific duty cycles. The duty cycles of one or more of the stages of the charge pump may be less than 50 percent duty cycles, e.g., less than 50 percent of an overall duty cycle of the multi-stage charge pump.

The charge pump circuit may include a plurality of switches (e.g., transistors or possibly diodes), which may operate in charge pump circuit in four or more phases to charge the different capacitors. According to this disclosure, the plurality of switches may be configured to control N stages of the charge pump circuit that each include a floating capacitor, wherein N is a positive integer greater than 1. An output of the charge pump circuit may be approximately $2^N$ times an input voltage that is provided to the charge pump circuit.

A first stage of the charge pump circuit may comprise a first floating capacitor that is charged according to a 50 percent duty cycle, and a second stage may comprise a second floating capacitor that is charged according to a 25 percent duty cycle. In some cases, the charge pump circuit may include a third stage, and a third floating capacitor of the third stage is charged according to a 12.5 percent duty cycle. Furthermore, in some examples, the charge pump circuit include a fourth stage, and a fourth floating capacitor of the fourth stage may be charged according to a 6.25 percent duty cycle. Any number (N) of stages may be used, where N is an integer greater than 1. The floating capacitor of each of the N stages is charged according to a duty cycle that is $1/2^n$ of a total duty cycle associated with all N stages, wherein n represents each integer associated each of the N stages.

Figure 1:
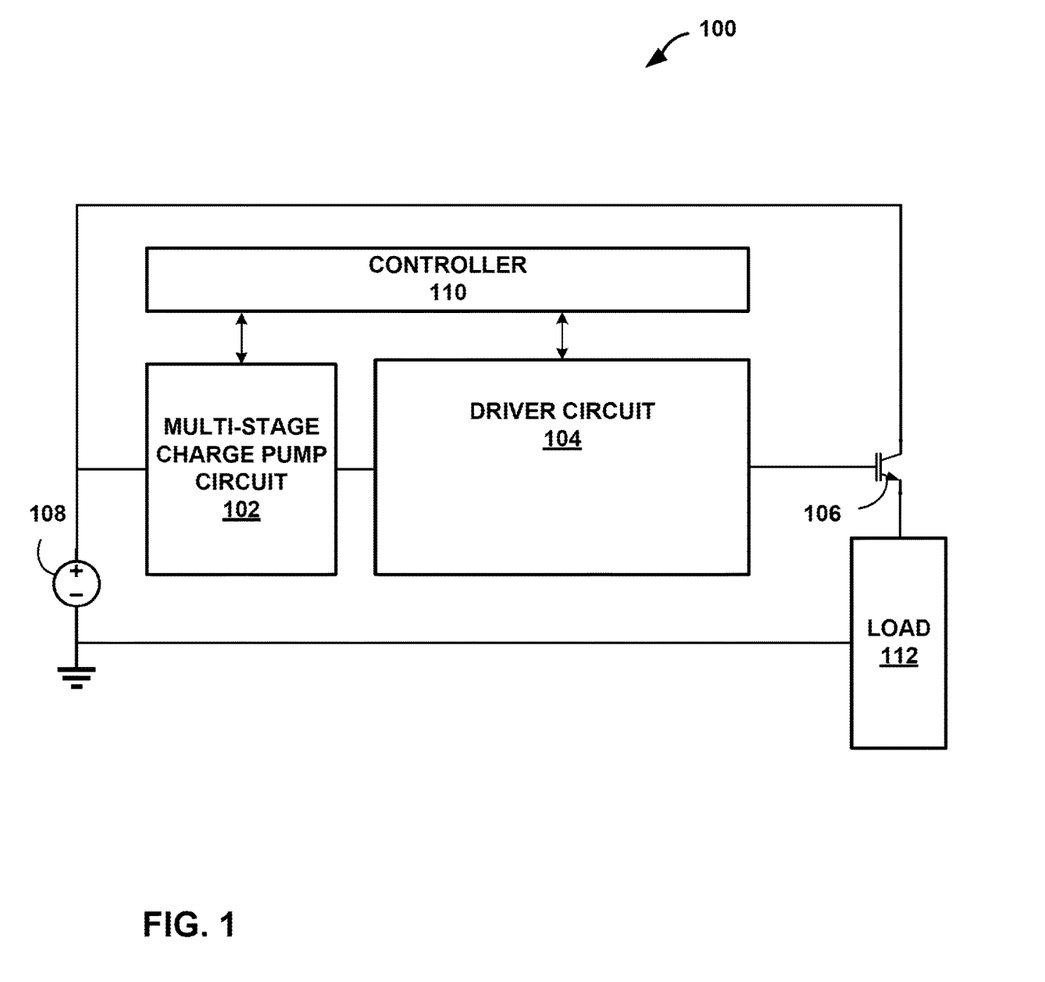
FIG. 1 is a block diagram of an example system that makes use of a multi-stage charge pump circuit.

FIG. 1 is a block diagram of an example system 100 that makes use of a multi-stage charge pump circuit 102. System 100 is merely one example use of a charge pump circuit, and there are many other devices and systems that may benefit from the charge pump circuits described herein. System 100 may comprise a control system for controlling a power transistor 106 in order to deliver power to a load 112. In some examples, power transistor 106 may comprise an NMOS power module used for delivering power to load 112. In this case, power transistor 106 may require a substantial gate to source voltage in order to turn power transistor 106 to an ON state.

Driver circuit 104 may control the on/off switching of power transistor 106 at the direction of controller 110. Controller 110 may comprise a microcontroller that sends control signals to driver circuit 104. Based on the control signals, driver circuit 104 sends modulation signals (e.g., pulse width modulation signals (PWM), pulse duration modulation signals, pulse density modulation signals, or other types of modulation signals) to control the ON/OFF switching of power transistor 106.

In some situations, the DC voltage provided by battery 108 may be insufficient to allow driver circuit 104 to turn power transistor 106 to an ON state. In automotive settings, for example, such as so-called "cold cranking" situations can significantly drain battery 108 due to the current drain of a starter motor that is supplied by battery 108. For these or other reasons, a multi-stage charge pump circuit 102 can be used to step-up the voltage of battery 108 to ensure that driver circuit 104 has adequate input supply for controlling power transistor 106. Again, this is merely one example use of a multi-stage charge pump circuit 102, and there are many other settings where charge pump circuits can be useful. In different examples, charge pump circuit 102 may form part of driver circuit 104 within the same integrated circuit (IC) or the circuits may be formed on separate IC chips. In some examples, portions of the circuit (or the entire circuit) could also be implemented using discrete circuit components.

Figure 2:
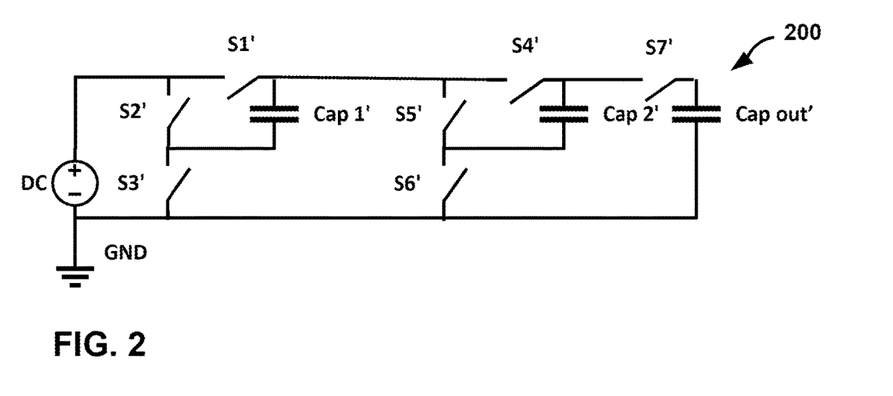
FIG. 2 is a block diagram showing an example two-stage charge pump circuit according to this disclosure.

FIG. 2 is a block diagram showing an example two-stage charge pump circuit 200 according to this disclosure. The stages (e.g., two in the example of FIG. 2) correspond to the number of "floating capacitors" in the circuit. According to this disclosure, a floating capacitor refers to a capacitor that is not permanently coupled to any defined circuit node, such as a ground voltage node or an input voltage node. In the example of FIG. 2, a first capacitor (Cap 1') and a second capacitor (Cap 2') are both "floating" because both the first capacitor (Cap 1') and a second capacitor (Cap 2') are not permanently coupled to either a ground voltage (GND) or to an input voltage defined by a battery (DC) or other DC voltage supply. In contrast, output capacitor (Cap out') is permanently coupled to the ground voltage (GND), and thus not floating.

Charge pump circuit 200 may operate in charging phases. In particular, charge pump circuit 200 comprises a plurality of switches (S1'-S7') that are configured to control phases of charge pump circuit 200 for charging a first capacitor (Cap 1'), a second capacitor (Cap 2') and a third capacitor (Cap out'). As described in greater detail below, the phases may include a first phase that charges the first capacitor (Cap 1') to a first voltage based on an input voltage defined by the battery (DC). The phases may also include a second phase that charges the second capacitor (Cap 2') to a second voltage based on the first voltage and the input voltage. Furthermore, the phases may include a third phase that charges the first capacitor (Cap 1') to a third voltage based on the input voltage. In addition, the phases may include a fourth phase that charges the third capacitor (Cap out') to a fourth voltage based the second voltage, the third voltage, and the input voltage.

In the example of FIG. 2, the plurality of switches (S1'-S7') include a first switch (S1') connected between a first plate of the first capacitor (Cap 1') and an input node associated with the input voltage of battery (DC), a second switch (S2') connected between a second plate of the first capacitor (Cap 1') and the input node, and a third switch (S3') connected between the second plate of the first capacitor (Cap 1') and a ground node (GND). The first capacitor (Cap 1') and switches S1', S2' and S3' may be viewed as forming a first stage of charge pump circuit 200.

Also in the example of FIG. 2, the plurality of switches (S1'-S7') include a fourth switch (S4') connected between a first plate of the second capacitor (Cap 2') and the first plate of the first capacitor (Cap 1'), a fifth switch (S5') connected between a second plate of the second capacitor (Cap 2') and the first plate of the first capacitor (Cap 1'), and a sixth switch (S6') connected between the second plate of the second capacitor (Cap 2') and the ground node (GND). The second capacitor (Cap 2') and switches S4', S5' and S6' may be viewed as forming a second stage of charge pump circuit 200.

In FIG. 2, the plurality of switches (S1'-S7') include a seventh switch S7' connected between the first plate of the second capacitor (Cap 2') and a first plate of the third capacitor (Cap out'). The plurality of switches (S1'-S7') may comprise transistors, although diodes could be used for some of the switches. In one example, the first switch (S1'), the second switch (S2'), the fourth switch (S4'), the fifth switch (S5'), and the seventh switch (S7') each comprise a PMOS transistor, and the third switch (S3') and the sixth switch (S6) each comprise an NMOS transistor. In another example, the first switch (S1'), the fourth switch (S4'), and the seventh switch (S7') each comprise a PMOS transistor, and the second switch (S2'), the third switch (S3'), the fifth switch (S5'), and the sixth switch (S6') each comprise an NMOS transistor. "PMOS" refers to a P-channel metal oxide semiconductor, and "NMOS" refers to an N-channel metal oxide semiconductor. In still other examples, the first switch (S1'), the fourth switch (S4'), and the seventh switch (S7') each comprise diodes, and the second switch (S2'), the third switch (S3'), the fifth switch (S5'), and the sixth switch (S6') each comprise transistors.

In the example shown in FIG. 2, over four phases of operation, the first capacitor (Cap 1') may be charged according to a 50 percent duty cycle. However, over four phases of operation, the second capacitor (Cap 2') may be charged according to a 25 percent duty cycle. After four phases, the third capacitor (Cap out') may be charged to approximately 4 times the input voltage of battery (DC). In this way, the third capacitor (Cap out') may store a stepped-up voltage that can be input to another circuit (such as a gate driver circuit) to control an NMOS power module.

In some examples, charge pump circuit 200 like that shown in FIG. 2 can be implemented with external capacitors and an IC with 7 or fewer pins. The pins, for example, may include: two pins configured to be connected to the first capacitor (Cap 1'); two pins configured to be connected to the second capacitor (Cap 2'); an input pin connected to battery (DC) or another an input voltage source, a ground pin (or reference pin) configured to be connected to a ground potential (GND) or another reference potential; and an output pin configured to be connected to the third capacitor (Cap out'). In this disclosure, ground or ground potential may generally refer to any grounded or defined reference potential, such as actual ground or any another known or controlled reference potential that is fixed.

Charge pump circuit 200 of FIG. 2 is a two-stage charge pump with two floating capacitors. However, the principles of this disclosure can be extended to any number of stages.

Figure 3:
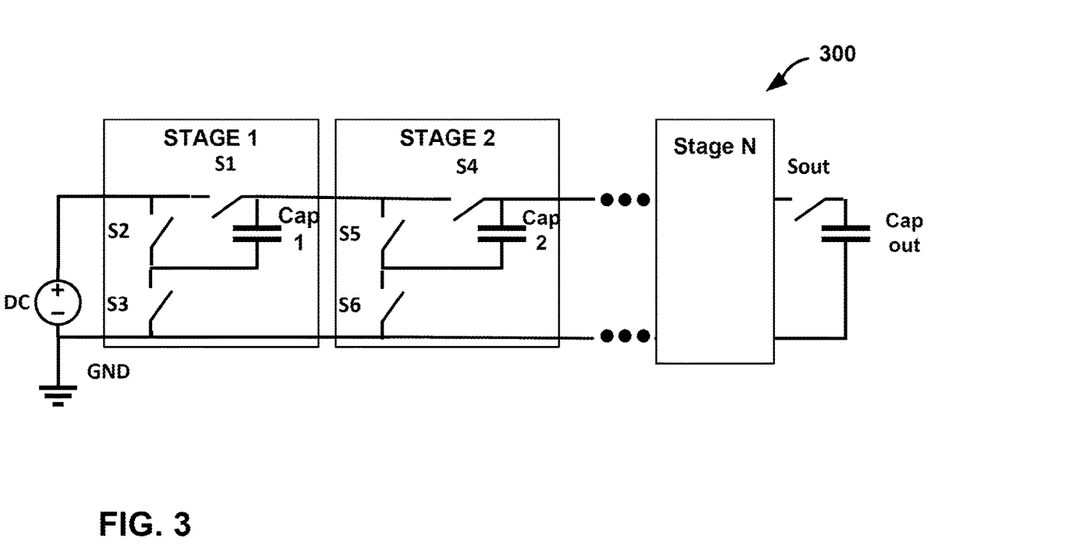
FIG. 3 is a is a block diagram showing an example N-stage charge pump circuit according to this disclosure, wherein N represents a positive integer greater than 1.

FIG. 3 is a is a block diagram showing an example N-stage charge pump circuit 300 according to this disclosure, wherein N represents a positive integer greater than 1. The stages (e.g., N) correspond to the number of "floating capacitors" in the circuit. Again, a floating capacitor refers to a capacitor that is not permanently coupled to any defined circuit node, such as a ground voltage node or an input voltage node. In the example of FIG. 3, a first capacitor (Cap 1) and a second capacitor (Cap 2) are both "floating" because both the first capacitor (Cap 1) and a second capacitor (Cap 2) are not permanently coupled to either a ground voltage (GND) or to an input voltage defined by a battery (DC) or other DC voltage supply. In contrast, output capacitor (Cap out) is not "floating" because it is permanently coupled to the ground voltage (GND). Any number "N" of floating capacitors can be used, each with a set of three switches positioned similarly to those in STAGE 1 (S1, S2, and S3) relative to Cap 1, and similar to those in STAGE 2 (S4, S5, and S6) relative to Cap 2.

Similar to charge pump circuit 200 shown in FIG. 2, charge pump circuit 300 of FIG. 3 may operate in charging phases. However, the total number of phases may depend on the number of stages, and the number of phases (P) may be defined as $P=2^N$, where N is the number of stages with a floating capacitor. Thus, with the two-stage example of FIG. 2, there are four charging phases. A three-stage example would include eight charging phases, and a four-stage example would include sixteen charging phases. In general, according to FIG. 3, a plurality of switches (e.g., S1, S2, and S3 for STAGE 1; S4, S5, and S6 for STAGE 2; additional sets of switches for each additional STAGE; and Sout) can be configured to control N stages of the charge pump circuit, wherein N is a positive integer greater than 1, and wherein an output of the charge pump circuit is approximately $2^N$ times the input voltage. Thus, the two-stage charge pump of FIG. 2 can achieve 4 times the input voltage, and a three-stage charge pump can achieve 8 times the input voltage. Similarly, a four-stage charge pump can achieve 16 times the input voltage, and a five-stage charge pump can achieve 32 times the input voltage.

Each of the N stages shown in FIG. 3 may include a floating capacitor that is not permanently coupled to either a ground voltage or the input voltage. The first capacitor (Cap 1) and the second capacitor (Cap 2) are the floating capacitors associated with first and second stages of charge pump circuit 300. Any number of stages N can be used, and thus, any number of floating capacitors can be used. The floating capacitor of each of the N stages may be charged according to a duty cycle that is $1/2^n$ of a total duty cycle associated with all N stages, wherein n represents each integer associated each of the N stages. For example, with a four-stage charge pump (N=4), a first capacitor (Cap 1) associated with a first stage (n=1) may be charged according to a duty cycle that is 50 percent of a total duty cycle associated with all N stages. A second capacitor (Cap 2) associated with a second stage (n=2) may be charged according to a duty cycle that is 25 percent of a total duty cycle associated with all N stages. A third capacitor (not illustrated in FIG. 3) associated with a third stage (n=3) may be charged according to a duty cycle that is 12.5 percent of a total duty cycle associated with all N stages. A fourth capacitor (not illustrated in FIG. 3) associated with a fourth stage (n=4) may be charged according to a duty cycle that is 6.25 percent of a total duty cycle associated with all N stages. These principles can be extended to any number of stages.

Figure 4A:
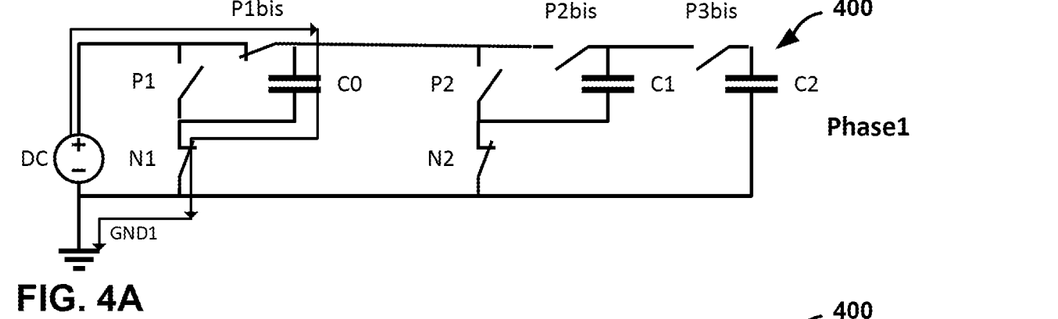
FIGS. 4A-4D show an example two-stage charge pump circuit operating in four charging phases.
Figure 4B:
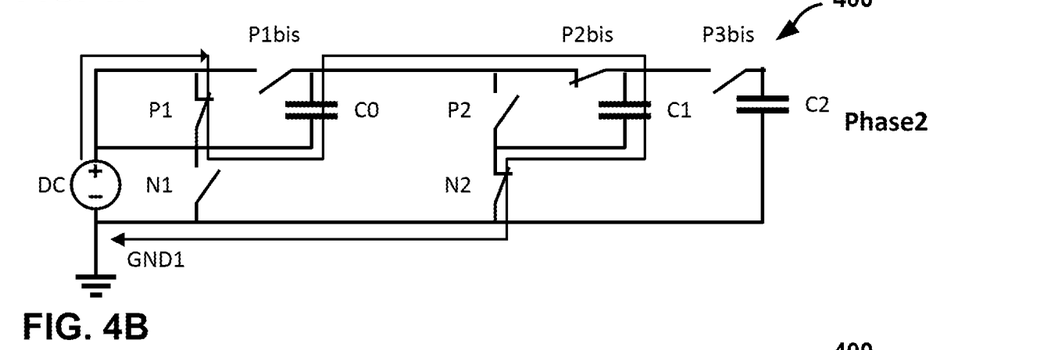
Figure 4C:
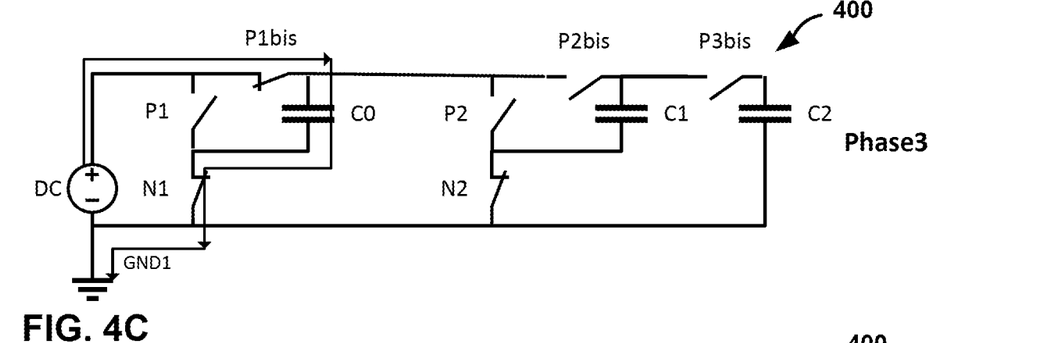
Figure 4D:
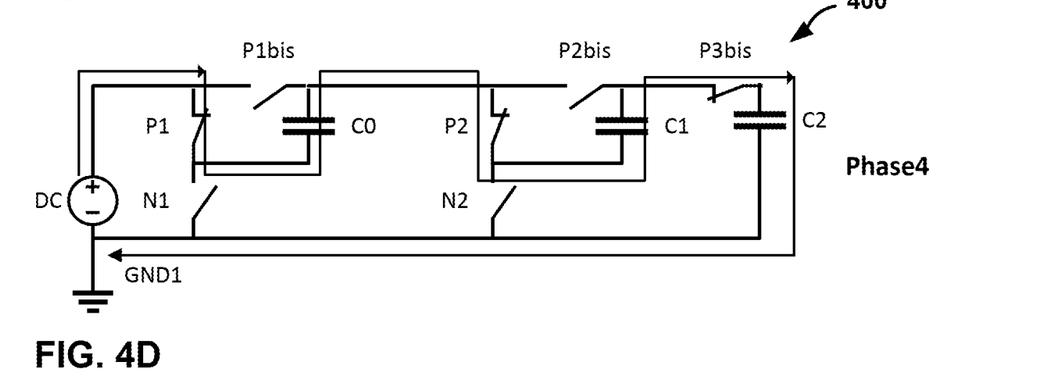

FIGS. 4A-4D show an example two-stage charge pump circuit 400 operating in four charging phases. FIG. 4A shows a first phase, FIG. 4B shows a second phase, FIG. 4C shows a third phase, and FIG. 4D shows a fourth phase. The example circuit 400 shown in FIGS. 4A-4D is very similar to that of FIG. 2, but FIGS. 4A-4D is a slightly more specific implementation than that shown in FIG. 2.

In the example of FIGS. 4A-4D, the plurality of switches are labeled as follows. A first switch (P1*bis*) comprises a PMOS transistor, a second switch (P1) comprises a PMOS transistor, and third switch (N1) comprises an NMOS transistor. The first, second, and third switches (P1*bis*, P1, and N1) along with a first floating capacitor (C0) collectively define a first stage of the charge pump circuit. In a second stage, a fourth switch (P2*bis*) comprises a PMOS transistor, a fifth switch (P2) comprises a PMOS transistor, and sixth switch (N2) comprises an NMOS transistor. The fourth, fifth, and sixth switches (P2*bis*, P2, and N2) along with a second floating capacitor (C1) collectively define a second stage of charge pump circuit 400. A seventh switch (P3bis) may define an output switch for charging an output capacitor (C2), which is not a floating capacitor because C2 is permanently coupled to ground.

The different switches shown in FIG. 4A-4D (P1bis, P1, N1, P2bis, P2, N2, and P3bis) are configured to control phases of charge pump circuit 400 for charging a first capacitor (C0), a second capacitor (C1), and a third capacitor (C2). The phases include a first phase that charges the first capacitor (C0) to a first voltage based on an input voltage defined by the battery (DC), and a second phase that charges the second capacitor (C1) to a second voltage based on the first voltage and the input voltage. Furthermore, the phases include a third phase that charges the first capacitor (C0) to a third voltage based on the input voltage, and a fourth phase that charges the third capacitor (C2) to a fourth voltage based the second voltage, the third voltage, and the input voltage.

Figure 5:
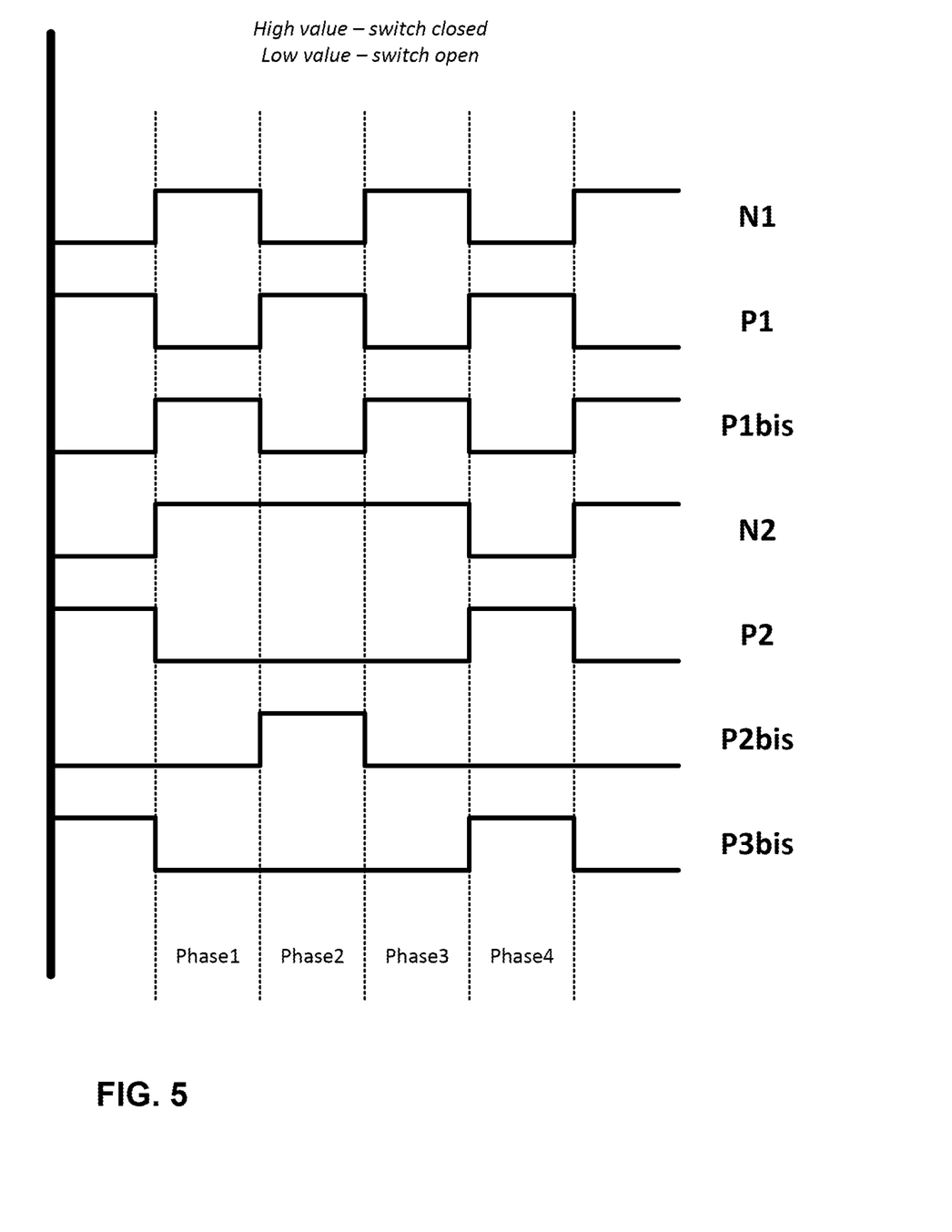
FIG. 5 is a timing diagram illustrating the timing and control of the different switches shown in FIGS. 4A-4D over four phases.

FIG. 5 is a timing diagram illustrating the timing and control of the different switches shown in FIG. 4A-4D (e.g., P1bis, P1, N1, P2bis, P2, N2 and P3bis) over four phases. The illustration of FIG. 5 shows high values to indicate that a switch is closed (i.e., the transistor is turned ON), and FIG. 5 shows low values to indicate that a switch is open (i.e. the transistor is turned OFF).

As shown in FIG. 4A and FIG. 5, in phase 1, N1 is closed, P1 is open, P1bis is closed, N2 is closed, P2 is open, P2bis is open, and P3bis is open. In phase 2, as shown in FIG. 4B and FIG. 5, N1 is open, P1 is closed, P1bis is open, N2 is closed, P2 is open, P2bis is closed, and P3bis is open. In phase 3, as shown in FIG. 4C and FIG. 5, N1 is closed, P1 is open, P1bis is closed, N2 is closed, P2 is open, P2bis is open and P3bis is open. In phase 4, as shown in FIG. 4D and FIG. 5, N1 is open, P1 is closed, P1bis is open, N2 is open, P2 is closed, P2bis is open, and P3is is closed The current path through circuit 400 of FIGS. 4A-4D is shown with an arrow extending from the battery (DC) though the circuit.

In a first phase shown in FIG. 4A, circuit 400 charges the first capacitor (C0) to a first voltage based on an input voltage defined by the battery (DC). In a second phase shown in FIG. 4B, circuit 400 charges the second capacitor (C1) to a second voltage based on the first voltage and the input voltage. In a third phase shown in FIG. 4C, circuit 400 charges the first capacitor (C0) to a third voltage based on the input voltage. In a fourth phase shown in FIG. 4D, circuit 400 charges the third capacitor (C2) to a fourth voltage based the second voltage, the third voltage, and the input voltage. In this way, the third capacitor (C2) can be charged to a to a voltage that is 4 times the input voltage of the battery (DC).

Figure 6:
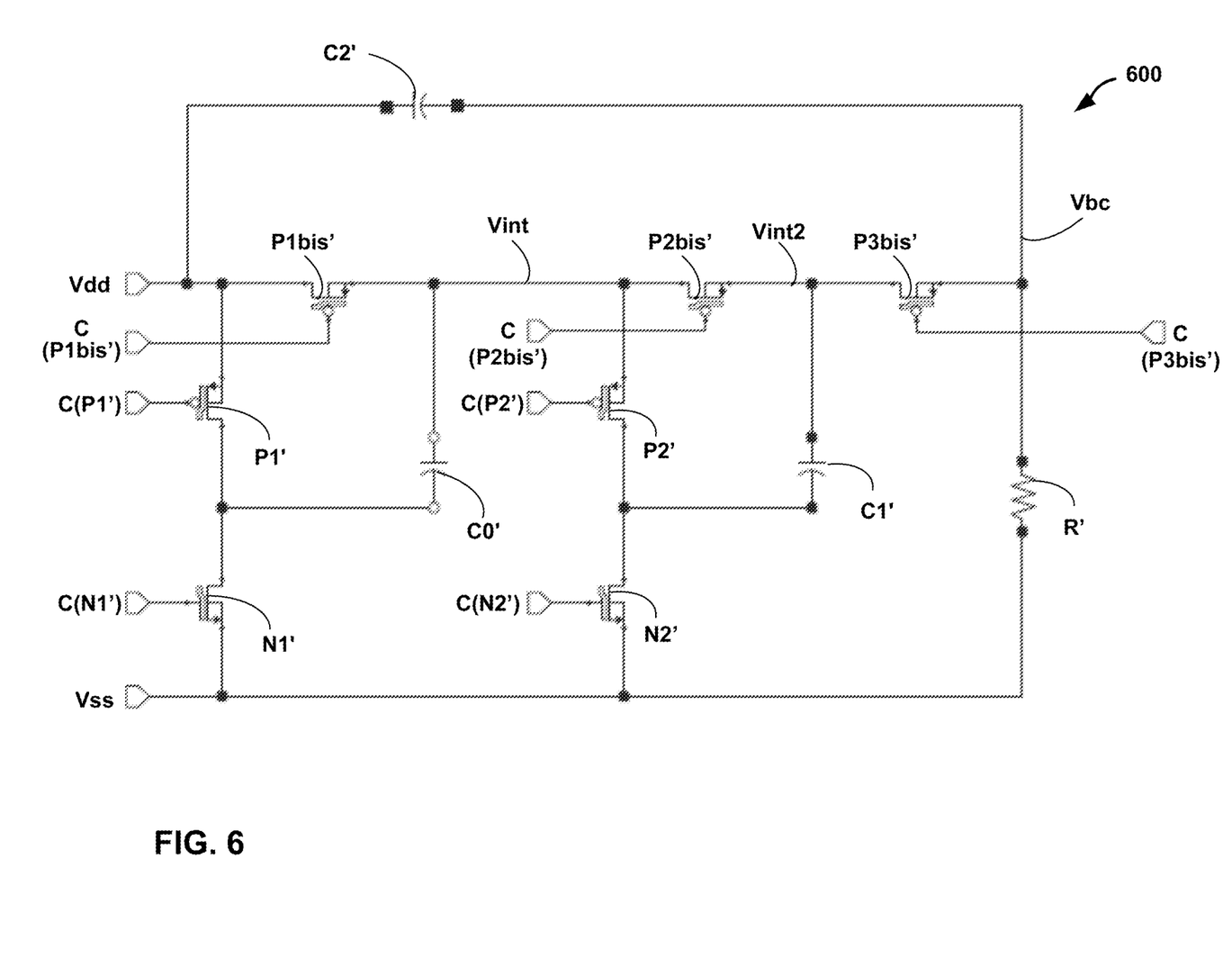
FIG. 6 is a circuit diagram showing another example two-stage charge pump circuit according to this disclosure.

FIG. 6 is a circuit diagram showing another example two-stage charge pump circuit according to this disclosure. The stages (e.g., two in the example of FIG. 6) correspond to the number of "floating capacitors" in the circuit. In the example of FIG. 6, a first capacitor (C0') and a second capacitor (C1') are both "floating" because both the first capacitor (C0') and a second capacitor (C1') are not permanently coupled to any defined voltage nodes. For example, neither first capacitor (C0') nor second capacitor (C1') are permanently connected to either Vdd or Vss voltage nodes. In contrast, output capacitor (Cap out') is not "floating" because it is permanently coupled to the supply node Vss. The arrangement shown in FIG. 6 may have some advantages of that shown in FIG. 2 because the output capacitor shown in FIG. 6 is coupled to Vdd (rather than GND). In this case, a capacitor with a lower voltage rating can be used, which can reduce cost of the circuit.

As with other examples above, charge pump circuit 600 of FIG. 6 may operate in charging phases. In particular, charge pump circuit 600 comprises a plurality of switches (P1bis', P1', N1', P2bis', P2', N2', and P3bis') that are configured to control phases of charge pump circuit 600 for charging a first capacitor (C0'), a second capacitor (C1'), and a third capacitor (C2'). The phases include a first phase that charges the first capacitor (C0') to a first voltage based on an input voltage Vdd (which may be a battery voltage), and a second phase that charges the second capacitor (C1') to a second voltage based on the first voltage and the input voltage. Furthermore, the phases include a third phase that charges the first capacitor (C0') to a third voltage based on the input voltage, and a fourth phase that charges the third capacitor (C2') to a fourth voltage based the second voltage, the third voltage, and the input voltage.

In the example of FIG. 6, the plurality of switches (P1bis', P1', N1', P2bis', P2', N2', and P3bis') include a first switch (P1bis') connected between a first plate of the first capacitor (C0') and an input node associated with the input voltage Vdd, a second switch (P1') connected between a second plate of the first capacitor (C0') and the input node, and a third switch (N1') connected between the second plate of the first capacitor (C0') and a reference voltage node (Vss), which may be a ground voltage or another controlled reference voltage). The first capacitor (0') and switches P1bis', P1' and N1' may be viewed as forming a first stage of charge pump circuit 600. Controls signals C(P1bis'), C(P1'), and C(N1') control the ON/OFF state of switches P1bis', P1', and N1'. The control signals, for example, may be sent via a controller (such as controller 110 shown in FIG. 1).

Also in the example of FIG. 6, the plurality of switches (P1bis', P1', N1', P2bis', P2', N2', and P3bis') include a fourth switch (P2bis') connected between a first plate of the second capacitor (C1') and the first plate of the first capacitor (C0'), a fifth switch (P2') connected between a second plate of the second capacitor (C1') and the first plate of the first capacitor (C0'), and a sixth switch (N2') connected between the second plate of the second capacitor (C1') and the reference voltage node (Vss). The second capacitor (C1') and switches (P2bis', P2' and N2') may be viewed as forming a second stage of charge pump circuit 600. Controls signals C(P2bis'), C(P2'), and C(N2') control the ON/OFF state of switches P2bis', P2', and N2'. The control signals may be sent via a controller (such as controller 110 shown in FIG. 1).

In FIG. 6, the plurality of switches (P1bis', P1', N1', P2bis', P2', N2', and P3bis') include a seventh switch P3bis' connected between the first plate of the second capacitor (C1') and a first plate of the third capacitor (C2'). A control signal C(P3bis') may control the ON/OFF state of switch P3bis'. In the two-stage example of FIG. 6, the third capacitor (C2') comprises an output capacitor. The plurality of switches (P1bis', P1', N1', P2bis', P2', N2', and P3bis') may comprise transistors, although diodes could be used for some of the switches. In one example, the first switch (P1bis'), the second switch (P1'), the fourth switch (P2bis'), the fifth switch (P2'), and the seventh switch (P3bis') each comprise a PMOS transistor, and the third switch (N1') and the sixth switch (N2) each comprise an NMOS transistor. In another example, diodes may be use for P1bis', P2bis', and Pbis', in which case, those switches would be passive switches that would not need control signals. Also, in some cases, it may be desirable to have current limitations for some or all of the switches (P1bis', P1', N1', P2bis', P2', N2', and P3*bis*') in order to decrease the power dissipation when the switches are ON. For example, some or all of the switches may have current limitations of approximately 50 mA.

In the example shown in FIG. 6, over four phases of operation, the first capacitor (C0') may be charged according to a 50 percent duty cycle. However, over four phases of operation, the second capacitor (C1') may be charged according to a 25 percent duty cycle. After four phases, the third capacitor (C2') may be charged to an output voltage Vbc that is approximately 4 times the input voltage Vdd. In this way, the third capacitor (C2') may store a stepped-up voltage that can be supplied to another circuit (such as a gate driver circuit) to control an NMOS power module. R' generally represents any load that can be connected to circuit 600 to receive the output voltage Vbc. The load R', for example, may comprise a gate driver circuit in some examples.

In some examples, charge pump circuit 600 like that shown in FIG. 6 can be implemented with external capacitors, an IC comprising the various switches, and 7 or fewer pins. The pins, for example, may include: two pins connected to the first capacitor (C0'); two pins connected to the second capacitor (C1'); an input pin connected to Vdd, a reference (or ground) pin connected to a Vss; and an output pin connected to the third capacitor (C2').

Figure 7A:
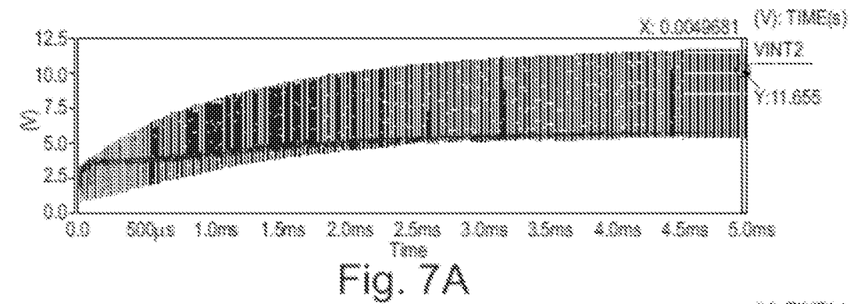
FIGS. 7A-7D are graphs showing example operation of the circuit illustrated in FIG. 6.
Figure 7B:
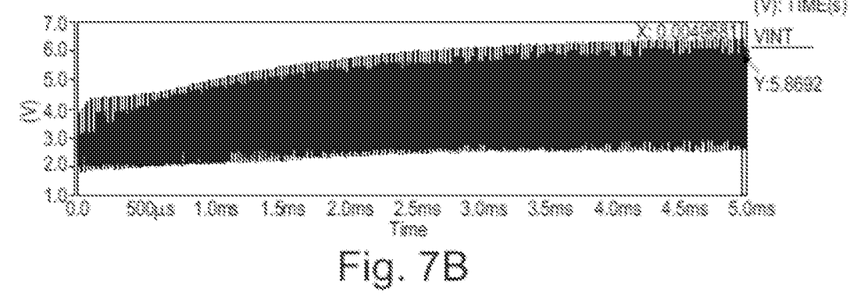
Figure 7C:
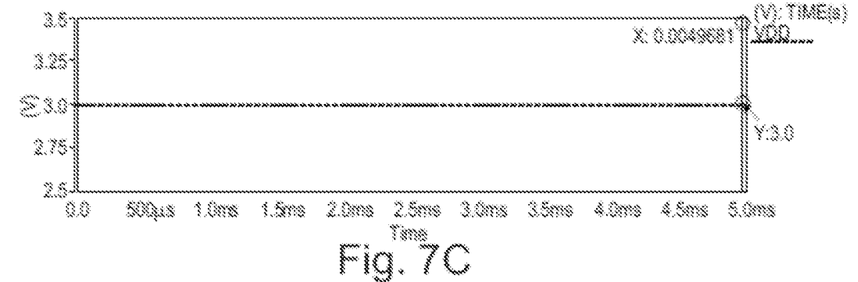
Figure 7D:
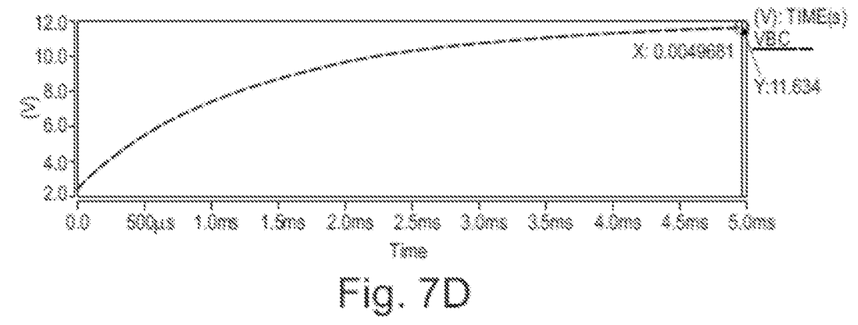

FIGS. 7A-7D are graphs showing example operation of circuit 600 illustrated in FIG. 6. FIG. 7A shows the voltage at node Vint2 of FIG. 6 over a 5 millisecond time period in which Capacitor C1' is charged to Vint2 (approximately 11.655 volts) over the 5 milliseconds. FIG. 7B shows the voltage at node Vint of FIG. 6 over a 5 millisecond time period in which Capacitor C0' is charged to Vint (approximately 5.869 volts) over the 5 milliseconds. FIG. 7C shows a constant input voltage Vdd of 3.0 volts over the 5 milliseconds. FIG. 7D shows the voltage at node Vbc of FIG. 6 over a 5 millisecond time period in which Capacitor C2' is charged to Vbc (approximately 11.634 volts) over the 5 milliseconds. In this case, Vbc may be sufficient to control an NMOS power module (or another high demand load) even if Vdd is insufficient for doing so. Discharging of the output capacitor (e.g., C2') may be performed by load R' and this discharging may be performed independently or separately from the phased operation of charging the capacitors within the charge pump circuit.

Figure 8:
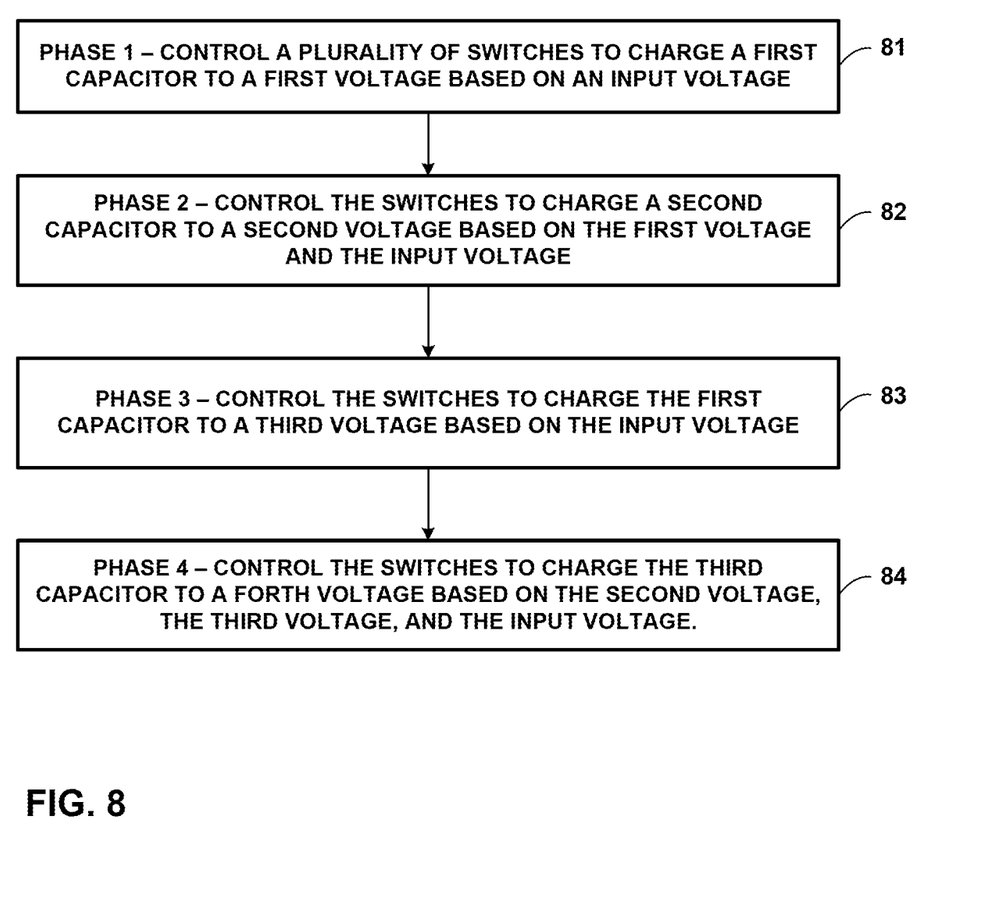
FIG. 8 is a flow diagram showing a method consistent with this disclosure.

FIG. 8 is a flow diagram showing a method consistent with this disclosure for controlling a two-stage charge pump circuit according to this disclosure. FIG. 8 will be described from the perspective of FIGS. 1, 2, although similar techniques would apply to other charge pump circuits described herein. According to FIG. 8, a controller (100) may be configured to control controller a plurality of switches (S1'-S7') of a multi-stage charge pump circuit (102, 200). In Phase 1, controller 100 controls the plurality of switches (S1'-S7') to charge a first capacitor (Cap 1') to a first voltage based on an input voltage (81). An example of a first phase is also shown in FIG. 4A with regard to circuit 400.

In Phase 2, controller 100 controls the plurality of switches (S1'-S7') to charge a second capacitor (Cap 2') to a second voltage based on the first voltage and the input voltage (82). An example of a second phase is also shown in FIG. 4B with regard to circuit 400. In Phase 3, controller 100 controls the plurality of switches (S1'-S7') to charge the first capacitor (Cap 1') to a third voltage based on the input voltage (83). An example of a third phase is also shown in FIG. 4C with regard to circuit 400. In Phase 4, controller 100 controls the plurality of switches (S1'-S7') to charge the third capacitor (Cap out') to a fourth voltage based the second voltage, the third voltage, and the input voltage (84). An example of a third phase is also shown in FIG. 4D with regard to circuit 400.

The example method shown in FIG. 8 is a method of controlling a two-stage charge pump circuit, with two floating capacitors according to this disclosure. However, the principles of this disclosure can be extended to any number of stages. With three stages, there would be eight phases for controlling the switches. With four stages, there would be sixteen phases for controlling the switches, with five stages, there would be thirty-two phases, and so forth.

With the two-stage example, after four phases, the third capacitor (e.g., Cap out') may be charged to approximately 4 times the input voltage supplied to the charge pump circuit 200. In this way, the third capacitor (Cap out') may store a stepped-up voltage that can be input to another circuit (such as a gate driver circuit) to control an NMOS power module. With a three-stage example, after eight phases, the output capacitor may be charged to approximately 8 times the input voltage supplied to the charge pump circuit. With a four-stage example, after sixteen phases, the output capacitor may be charged to approximately 16 times the input voltage supplied to the charge pump circuit.

More generally, according to this disclosure, a controller can be configured to control N stages of a charge pump circuit, where each stage includes a floating capacitor, where N is a positive integer greater than 1, and wherein an output of the charge pump circuit is approximately $2^N$ times the input voltage. The described circuit can be implemented in an integrated circuit package and external capacitors using seven or fewer pins as described herein.

The following clauses may illustrate one or more aspects of the disclosure.

Clause 1—A charge pump circuit comprising: a plurality of switches configured to control phases of the charge pump circuit for charging a first capacitor, a second capacitor and a third capacitor, wherein the phases include: a first phase that charges the first capacitor to a first voltage based on an input voltage; a second phase that charges the second capacitor to a second voltage based on the first voltage and the input voltage; a third phase that charges the first capacitor to a third voltage based on the input voltage; and a fourth phase that charges the third capacitor to a fourth voltage based the second voltage, the third voltage, and the input voltage.

Clause 2—The charge pump circuit of clause 1, wherein the first capacitor and the second capacitor are floating capacitors that are not permanently coupled to either a ground voltage node or an input voltage node that supplies the input voltage, and wherein the third capacitor is an output capacitor permanently coupled to either the ground voltage node or the input voltage node.

Clause 3—The charge pump circuit of clause 1 or 2, wherein the set of switches include: a first switch connected between a first plate of the first capacitor and an input node associated with the input voltage; a second switch connected between a second plate of the first capacitor and the input node; and a third switch connected between the second plate of the first capacitor and a ground node.

Clause 4—The charge pump circuit of clause 3, wherein the set of switches include: a fourth switch connected between a first plate of the second capacitor and the first plate of the first capacitor; a fifth switch connected between a second plate of the second capacitor and the first plate of the first capacitor; and a sixth switch connected between the second plate of the second capacitor and the ground node.

Clause 5—The charge pump circuit of clause 4, wherein the set of switches include a seventh switch connected between the first plate of the second capacitor and a first plate of the third capacitor.

Clause 6—The charge pump circuit of clause 5, wherein: the first switch, the second switch, the fourth switch, the fifth switch, and the seventh switch each comprise a PMOS transistor; and wherein the third switch and the sixth switch each comprise an NMOS transistor.

Clause 7—The charge pump of clause 5, wherein: the first switch, the fourth switch, and the seventh switch each comprise diodes; and the second switch, the third switch, the fifth switch, and the sixth switch each comprise transistors.

Clause 8—The charge pump circuit of any of clauses 1-7, wherein over the four phases: the first capacitor is charged according to a 50 percent duty cycle; and the second capacitor is charged according to a 25 percent duty cycle.

Clause 9—The charge pump circuit of any of clauses 1-8, wherein following the fourth phase, the third capacitor is charged to approximately 4 times the input voltage.

Clause 10—The change pump circuit of any of clauses 1-9, wherein the charge pump circuit includes 7 or fewer pins.

Clause 11—The charge change pump circuit of clause 10, the pins include: two pins configured to be connected to the first capacitor; two pins configured to be connected to the second capacitor; an input pin configured to be connected to an input voltage source that supplies the input voltage; a ground or reference pin configured to be connected to a ground or reference potential; and an output pin configured to be connected to the third capacitor.

Clause 12—The charge pump circuit of any of clauses 1-11, wherein the plurality of switches are configured to control N stages of the charge pump circuit, wherein N is a positive integer greater than 1, and wherein an output of the charge pump circuit is approximately $2^N$ times the input voltage.

Clause 13—The charge pump circuit of clause 12, wherein each of the N stages includes a floating capacitor that is not permanently coupled to either a ground voltage or the input voltage, wherein the first capacitor and the second capacitor are the floating capacitors associated with first and second stages of the charge pump circuit.

Clause 14—The charge pump circuit of clause 13, wherein the floating capacitor of each of the N stages is charged according to a duty cycle that is $1/2^n$ of a total duty cycle associated with all N stages, wherein n represents each integer associated each of the N stages.

Clause 15—A method comprising: controlling a plurality of switches to control phases of a charge pump circuit for charging a first capacitor, a second capacitor and a third capacitor, wherein controlling the phases includes: controlling a first phase to charge the first capacitor to a first voltage based on an input voltage; controlling a second phase to charge the second capacitor to a second voltage based on the first voltage and the input voltage; controlling a third phase to charge the first capacitor to a third voltage based on the input voltage; and controlling a fourth phase to charge the third capacitor to a fourth voltage based the second voltage, the third voltage, and the input voltage.

Clause 16—The method of clause 15, wherein the first capacitor and the second capacitor are floating capacitors that are not permanently coupled to either a ground voltage or the input voltage, and wherein the third capacitor is a an output capacitor permanently coupled to either the ground voltage or the input voltage.

Clause 17—The method of clause 15 or 16, wherein controlling the plurality of switches includes controlling N stages of the charge pump circuit, wherein an output of the charge pump circuit is approximately $2^N$ times the input voltage, wherein each of the N stages includes a floating capacitor that is not permanently coupled to either a ground voltage or the input voltage, wherein the first capacitor and the second capacitor are the floating capacitors associated with first and second stages of the charge pump circuit, and wherein N is a positive integer greater than 1.

Clause 18—The method of clause 17, wherein the floating capacitor of each of the N stages is charged according to a duty cycle that is $1/2^n$ of a total duty cycle associated with all N stages, wherein n represents each integer associated each of the N stages.

Clause 19—A charge pump circuit comprising: a first capacitor, a second capacitor, a third capacitor, and a plurality of switches configured to control phases of the charge pump circuit for charging the first capacitor, the second capacitor and the third capacitor, wherein the phases include: a first phase that charges the first capacitor to a first voltage based on an input voltage; a second phase that charges the second capacitor to a second voltage based on the first voltage and the input voltage; a third phase that charges the first capacitor to a third voltage based on the input voltage; and a fourth phase that charges the third capacitor to a fourth voltage based the second voltage, the third voltage, and the input voltage.

Clause 20—The charge pump circuit of clause 19, wherein the charge pump circuit includes N stages, wherein each of the N stages includes a floating capacitor that is not permanently coupled to either a ground voltage or the input voltage, wherein the first capacitor and the second capacitor are floating capacitors associated with first and second stages of the charge pump circuit, wherein N is a positive integer greater than 1, and wherein an output of the charge pump circuit is approximately $2^N$ times the input voltage.

Clause 21—The charge pump circuit of clause 20, wherein the floating capacitor of each of the N stages is charged according to a duty cycle that is $1/2^n$ of a total duty cycle associated with all N stages, wherein n represents each integer associated each of the N stages.

Various aspects have been described in this disclosure. These and other aspects are within the scope of the following claims.

The invention claimed is:

1. An N-stage charge pump circuit that includes an output capacitor and N stages, wherein N is a positive integer greater than 1, and wherein each of the N stages includes a floating capacitor, the circuit comprising:
   a plurality of switches configured to control phases of the charge pump circuit for charging a first capacitor, a second capacitor and a third capacitor, wherein the phases include:
   a first phase that charges the first capacitor to a first voltage based on an input voltage;
   a second phase that charges the second capacitor to a second voltage based on the first voltage and the input voltage;
   a third phase that charges the first capacitor to a third voltage based on the input voltage; and
   a fourth phase that charges the third capacitor to a fourth voltage based on the second voltage, the third voltage, and the input voltage, wherein the output capacitor is charged according to a duty cycle that is $1/2^N$ of a total duty cycle associated with all phases of the N-stage charge pump and wherein the output capacitor is charged to approximately $2^N$ times the input voltage during the duty cycle that is $1/2^N$ of a total duty cycle associated with all phases.

2. The N-stage charge pump circuit of claim 1, wherein the first capacitor and the second capacitor are the floating capacitors associated with a first stage and a second stage and the floating capacitors are not permanently coupled to either a ground voltage node or an input voltage node that supplies the input voltage, and wherein the third capacitor is the output capacitor permanently coupled to either the ground voltage node or the input voltage node.

3. The N-stage charge pump circuit of claim 1, wherein the set of switches include:
a first switch connected between a first plate of the first capacitor and an input node associated with the input voltage;
a second switch connected between a second plate of the first capacitor and the input node; and
a third switch connected between the second plate of the first capacitor and a ground node.

4. The N-stage charge pump circuit of claim 3, wherein the set of switches include:
a fourth switch connected between a first plate of the second capacitor and the first plate of the first capacitor;
a fifth switch connected between a second plate of the second capacitor and the first plate of the first capacitor; and
a sixth switch connected between the second plate of the second capacitor and the ground node.

5. The N-stage charge pump circuit of claim 4, wherein the set of switches include a seventh switch connected between the first plate of the second capacitor and a first plate of the third capacitor.

6. The N-stage charge pump circuit of claim 5, wherein:
the first switch, the second switch, the fourth switch, the fifth switch, and the seventh switch each comprise a PMOS transistor; and
wherein the third switch and the sixth switch each comprise an NMOS transistor.

7. The N-stage charge pump of claim 5, wherein:
the first switch, the fourth switch, and the seventh switch each comprise diodes; and
the second switch, the third switch, the fifth switch, and the sixth switch each comprise transistors.

8. The N-stage charge pump circuit of claim 1, wherein over the four phases:
the first capacitor is charged according to a 50 percent duty cycle; and
the second capacitor is charged according to a 25 percent duty cycle.

9. The N-stage charge pump circuit of claim 1, wherein following the fourth phase, the third capacitor is charged to approximately 4 times the input voltage.

10. The N-stage change pump circuit of claim 1, wherein the charge pump circuit includes 7 or fewer pins.

11. The N-stage charge change pump circuit of claim 10, wherein the pins include:
two pins configured to be connected to the first capacitor;
two pins configured to be connected to the second capacitor;
an input pin configured to be connected to an input voltage source that supplies the input voltage;
a ground or reference pin configured to be connected to a ground or reference potential; and
an output pin configured to be connected to the third capacitor.

12. The N-stage charge pump circuit of claim 1, wherein the first capacitor and the second capacitor are the floating capacitors associated with first and second stages of the charge pump circuit.

13. The N-stage charge pump circuit of claim 12, wherein the floating capacitor of each of the N stages is charged according to a duty cycle that is $1/2^n$ of a total duty cycle associated with all N stages, wherein n represents each integer associated each of the N stages.

14. A method of controlling an N-stage charge pump circuit that includes an output capacitor and N stages, wherein N is a positive integer greater than 1, and wherein each of the N stages includes a floating capacitor, the method comprising:
controlling a plurality of switches to control phases of the N-staged charge pump circuit for charging a first capacitor, a second capacitor and a third capacitor, wherein controlling the phases includes:
controlling a first phase to charge the first capacitor to a first voltage based on an input voltage;
controlling a second phase to charge the second capacitor to a second voltage based on the first voltage and the input voltage;
controlling a third phase to charge the first capacitor to a third voltage based on the input voltage; and
controlling a fourth phase to charge the third capacitor to a fourth voltage based on the second voltage, the third voltage, and the input voltage, wherein the output capacitor is charged according to a duty cycle that is $1/2^N$ of a total duty cycle associated with all phases of the N-stage charge pump and wherein the output capacitor is charged to approximately $2^N$ times the input voltage during the duty cycle that is $1/2^N$ of a total duty cycle associated with all phases.

15. The method of claim 14, wherein the first capacitor and the second capacitor are the floating capacitors associated with a first stage and a second stage and the floating capacitors are not permanently coupled to either a ground voltage or the input voltage, and wherein the third capacitor is the output capacitor permanently coupled to either the ground voltage or the input voltage.

16. The method of claim 14, wherein the floating capacitor of each of the N stages is charged according to a duty cycle that is $1/2^n$ of a total duty cycle associated with all N stages, wherein n represents each integer associated each of the N stages.

17. An N-stage charge pump circuit that includes an output capacitor and N stages, wherein N is a positive integer greater than 1, and wherein each of the N stages includes a floating capacitor, the circuit comprising:
a first capacitor,
a second capacitor,
a third capacitor, and
a plurality of switches configured to control phases of the charge pump circuit for charging the first capacitor, the second capacitor and the third capacitor, wherein the phases include:
a first phase that charges the first capacitor to a first voltage based on an input voltage;
a second phase that charges the second capacitor to a second voltage based on the first voltage and the input voltage;
a third phase that charges the first capacitor to a third voltage based on the input voltage; and
a fourth phase that charges the third capacitor to a fourth voltage based on the second voltage, the third voltage, and the input voltage, wherein the output capacitor is charged according to a duty cycle that is $1/2^N$ of a total duty cycle associated with all phases of the N-stage charge pump and wherein the output capacitor is charged to approximately $2^N$ times the input voltage during the duty cycle that is $1/2^N$ of a total duty cycle associated with all phases.

18. The charge pump circuit of claim 17, wherein the first capacitor and the second capacitor are the floating capacitors associated with the first and second stages of the charge pump circuit.

19. The charge pump circuit of claim 18, wherein the floating capacitor of each of the N stages is charged according to a duty cycle that is $1/2^n$ of a total duty cycle associated with all N stages, wherein n represents each integer associated each of the N stages.

* * * * *